(12) United States Patent
Aton

(10) Patent No.: US 7,263,684 B2
(45) Date of Patent: Aug. 28, 2007

(54) CORRECTING A MASK PATTERN BY SELECTIVELY UPDATING THE POSITIONS OF SPECIFIC SEGMENTS

(75) Inventor: Thomas J. Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 228 days.

(21) Appl. No.: 11/005,866

(22) Filed: Dec. 6, 2004

(65) Prior Publication Data

US 2006/0123379 A1    Jun. 8, 2006

(51) Int. Cl.
*G06F 17/50*    (2006.01)
(52) U.S. Cl. .......................................... 716/21; 716/19
(58) Field of Classification Search ............ 716/19–21; 430/22, 30
See application file for complete search history.

(56) References Cited

U.S. PATENT DOCUMENTS

| | | | |
|---|---|---|---|
| 5,242,770 A | 9/1993 | Chen et al. | |
| 5,447,810 A | 9/1995 | Chen et al. | |
| 6,532,585 B1 * | 3/2003 | Petranovic et al. | 716/19 |
| 6,792,593 B2 * | 9/2004 | Takashima et al. | 716/21 |
| 7,065,739 B2 * | 6/2006 | Kobayashi et al. | 716/21 |
| 2003/0126582 A1 * | 7/2003 | Kobayashi et al. | 716/21 |
| 2003/0140330 A1 * | 7/2003 | Tanaka et al. | 716/19 |

OTHER PUBLICATIONS

"*Proteus, Progen, Prospector Full-Chip Optical Proximity Correction*", Data Sheet, Synopsys, © 2004 Synopsys, Inc., 9 pages, Oct. 2004.

* cited by examiner

*Primary Examiner*—Jack Chiang
*Assistant Examiner*—Binh Tat
(74) *Attorney, Agent, or Firm*—Jacqueline J. Garner; W. James Brady, III; Frederick J. Telecky, Jr.

(57) ABSTRACT

Correcting a mask pattern includes accessing the mask pattern segmented into segments. An attribute value is established for each segment, where the attribute value for a segment describes an attribute of the segment. The following is repeated for one or more of the attribute values to generate a corrected mask pattern: selecting segments using one or more attribute values; calculating a current correction value for each of the selected segments with respect to previously selected segments updated according to previously calculated correction values; and updating the selected segments according to the current correction values.

25 Claims, 4 Drawing Sheets

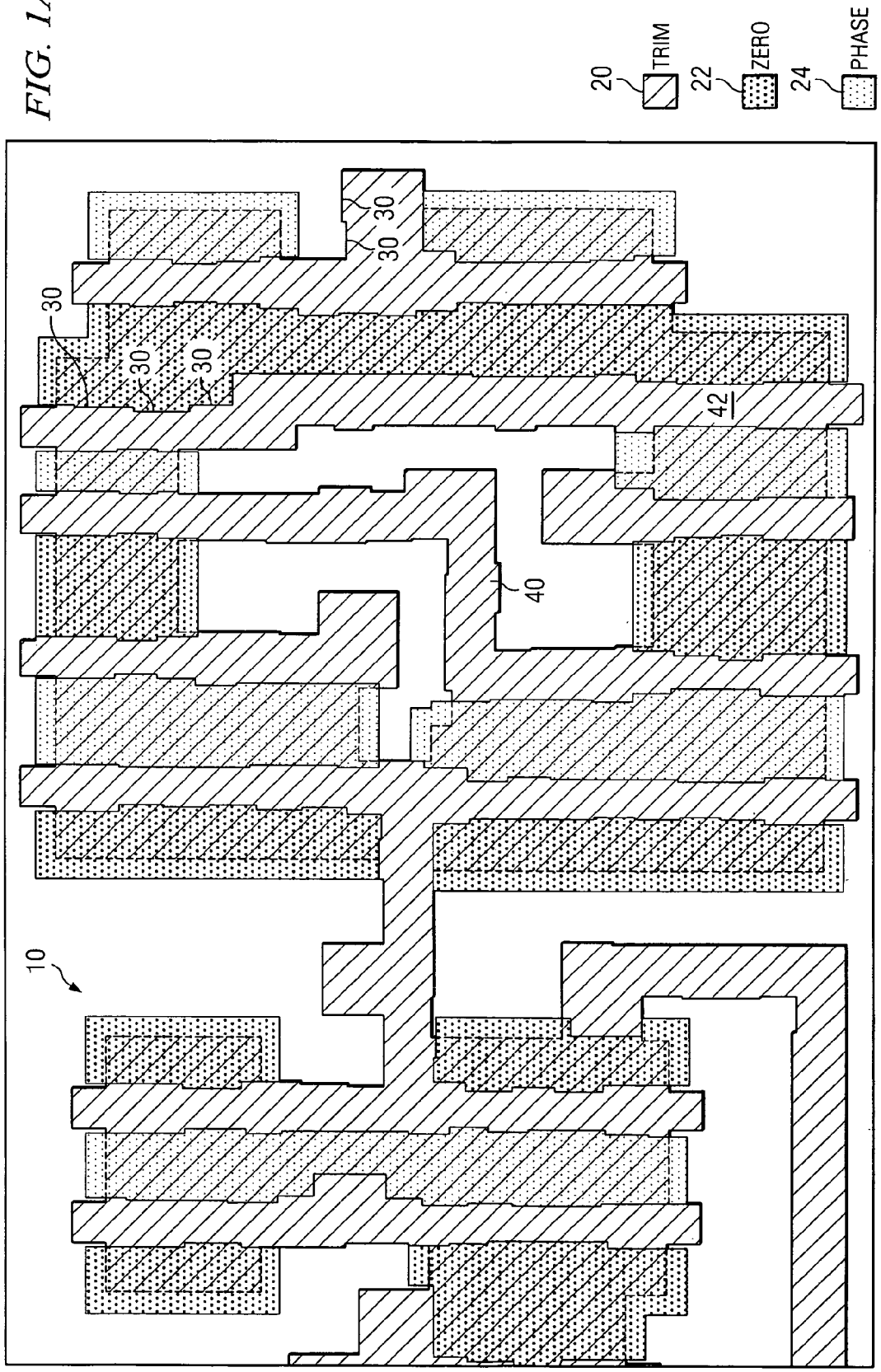

CORRECTING A MASK PATTERN BY SELECTIVELY UPDATING THE POSITIONS OF SPECIFIC SEGMENTS

TECHNICAL FIELD

This invention relates generally to the field of integrated circuits and more specifically to correcting a mask pattern by selectively updating the positions of specific segments.

BACKGROUND

Masks such as photomasks are typically used in photolithographic systems to define patterns on objects such as integrated circuits. The pattern defined on the object, however, may sometimes differ from the pattern of the mask. For example, optical diffraction may cause the pattern defined on an integrated circuit to differ from the pattern of the mask.

A mask pattern may be corrected to compensate for these deviations. According to a known technique for correcting a mask pattern, a pattern may be divided into segments. A correction value may be determined for each segment of the pattern, and the segments may then be updating according to the correction values. The known technique, however, may not be efficient in certain situations. It is generally desirable to be efficient in certain situations.

SUMMARY OF THE DISCLOSURE

In accordance with the present invention, disadvantages and problems associated with previous techniques for correcting a mask pattern may be reduced or eliminated.

According to one embodiment of the present invention, correcting a mask pattern includes accessing the mask pattern segmented into segments. An attribute value is established for each segment, where the attribute value for a segment describes an attribute of the segment. The following is repeated for one or more of the attribute values to generate a corrected mask pattern: selecting segments using one or more attribute values; calculating a current correction value for each of the selected segments with respect to previously selected segments updated according to previously calculated correction values; and updating the selected segments according to the current correction values.

Certain embodiments of the invention may provide one or more technical advantages. A technical advantage of one embodiment may be that specific segments of a mask pattern may be selected for adjustment during an iteration of a correction procedure. The segments may be selected according to attribute values. Adjusting specific segments may provide for more targeted correction of a mask pattern. Another technical advantage of one embodiment may be that adjusting selected segments instead of all segments during an iteration may improve computational efficiency. Another technical advantage of one embodiment may be that certain segments may be adjusted during a first iteration, and different segments may be adjusted during a second iteration with respect to the segments adjusted during the first iteration.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 1A illustrates an example mask pattern for a mask that includes a trim layer pattern, a zero phase layer pattern, and a pi phase layer pattern;

DETAILED DESCRIPTION OF THE DRAWINGS

Figure 1B:
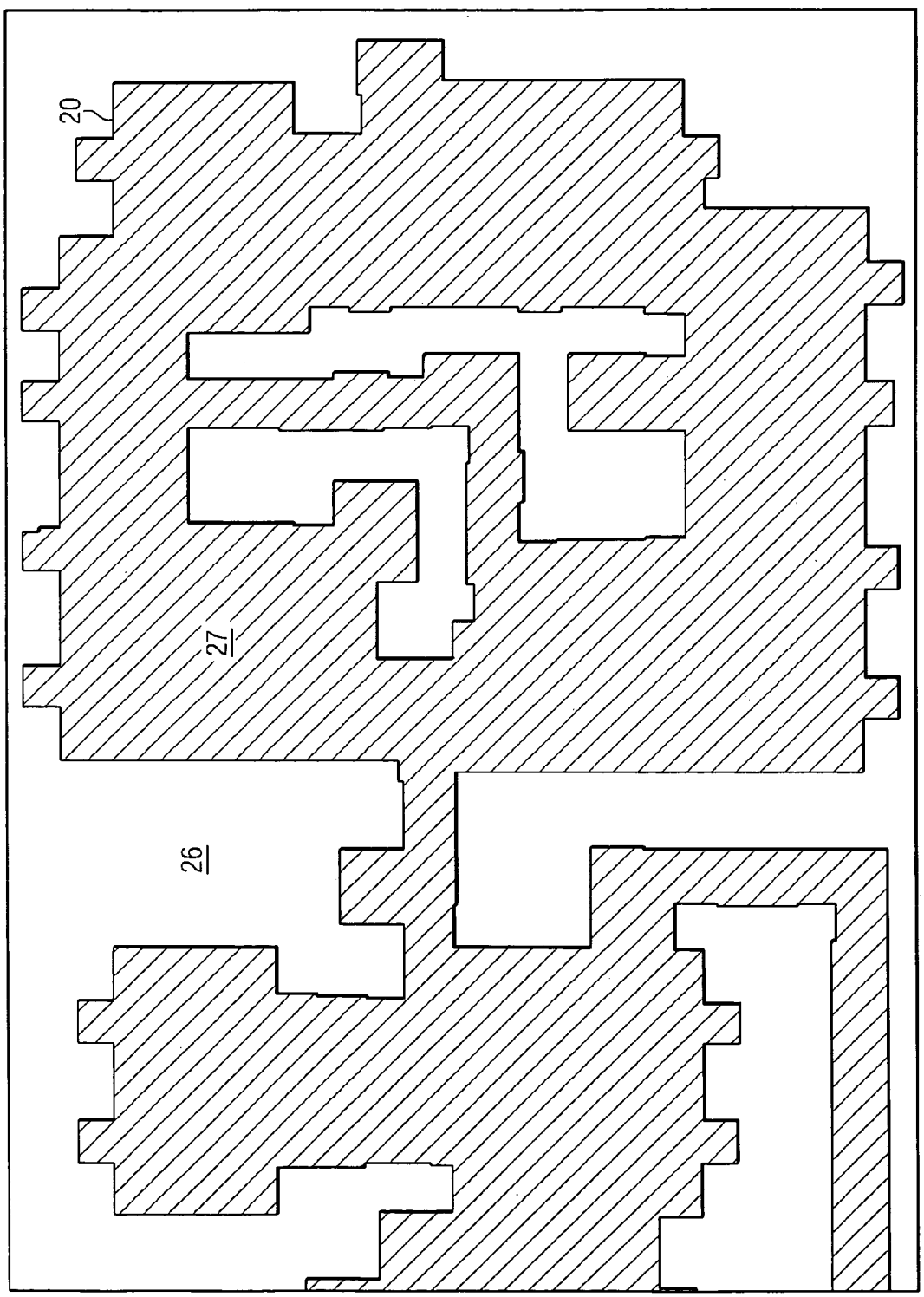
FIG. 1B illustrates an example trim layer pattern of FIG. 1A.
Figure 1C:
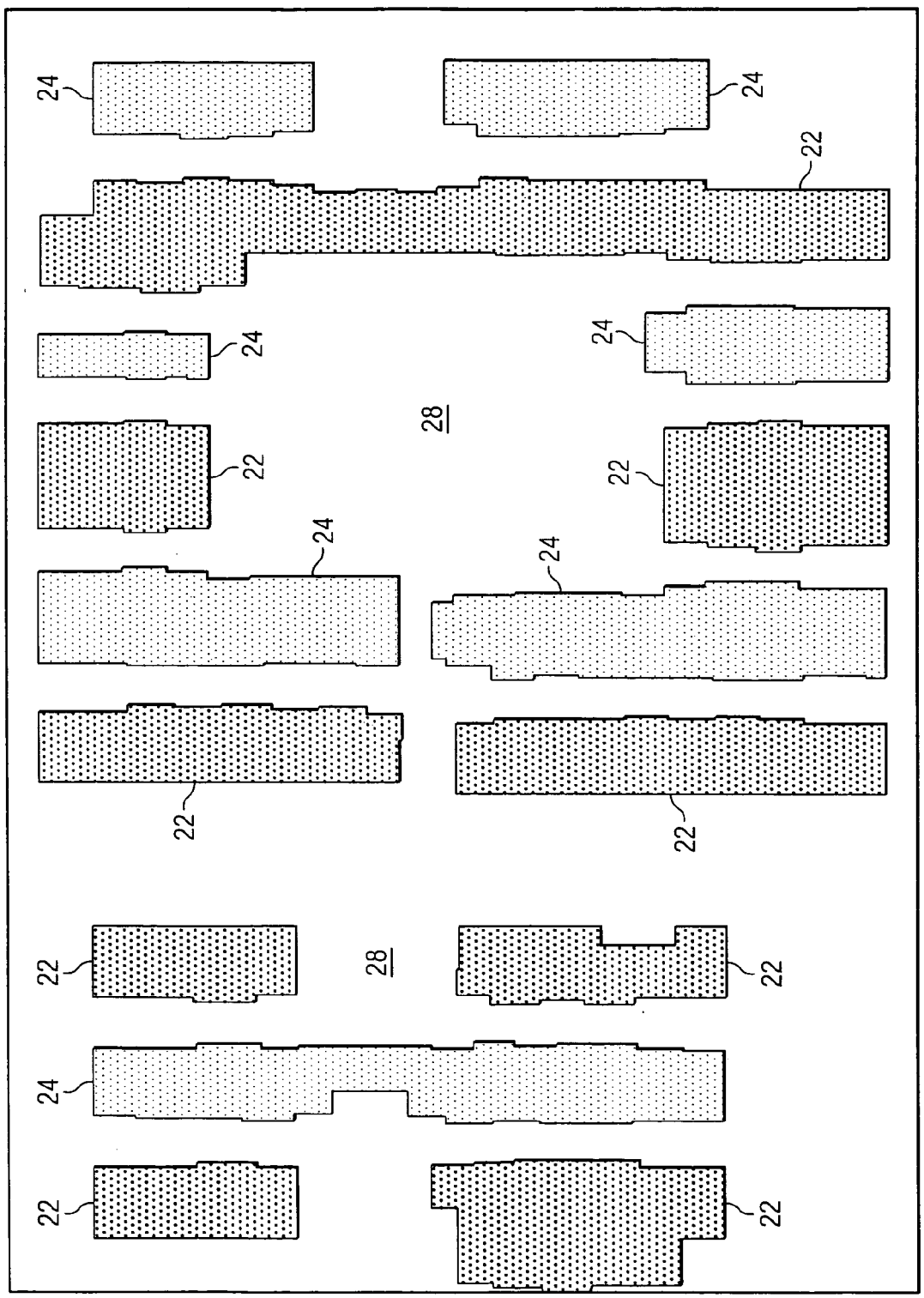
FIG. 1C illustrates an example zero phase layer pattern and pi phase layer pattern of FIG. 1A.
Figure 2:
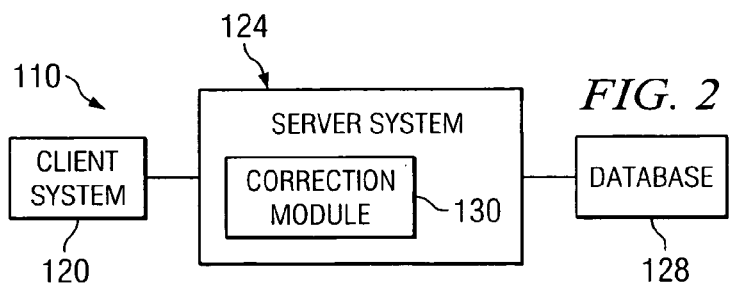
FIG. 2 is a block diagram illustrating one embodiment of a system for correcting a mask pattern.
Figure 3:
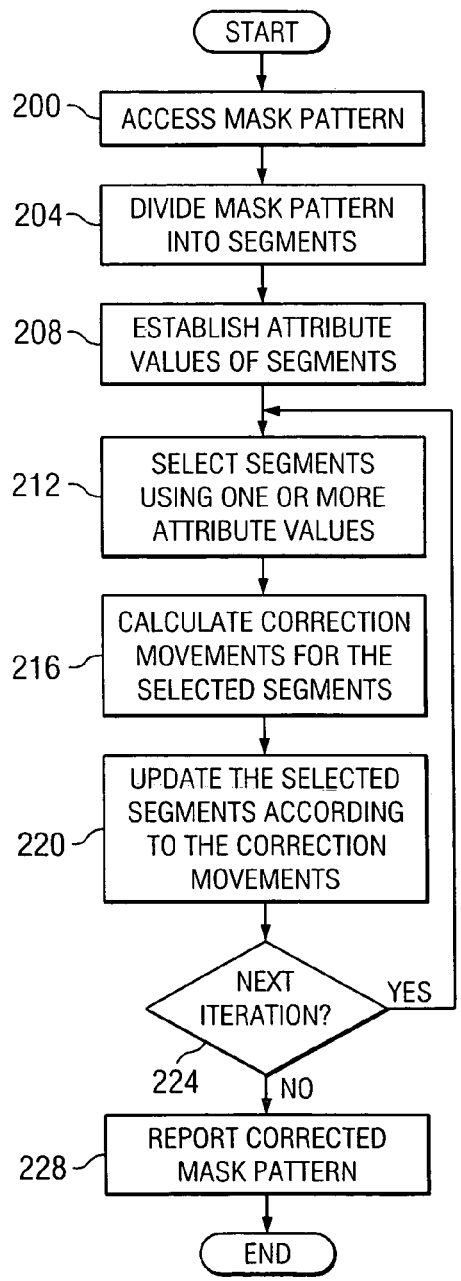
FIG. 3 is a flowchart illustrating one embodiment of a method for correcting a mask pattern.

Embodiments of the present invention and its advantages are best understood by referring to FIGS. 1 through 3 of the drawings, like numerals being used for like and corresponding parts of the various drawings.

FIG. 1A illustrates an example mask pattern 10 that includes a trim layer pattern 20, a zero phase layer pattern 22, and a pi phase layer pattern 24. A mask may refer to a photomask typically used in a photolithographic system to define a desired pattern on an object such as an integrated circuit. Typically, a mask is placed between a light source and the object. The mask selectively blocks and modifies light from the light source to define a pattern on the object. A mask pattern may refer to a pattern of a mask or any suitable portion of a mask that defines the desired pattern on the object. For example, a mask pattern may refer to a pattern of a mask, a layer of a mask, or a region of a mask.

Mask pattern 10 may be corrected to compensate for deviations between mask pattern 10 and the pattern desired on the object. To perform the correction, mask pattern 10 may be divided into segments 30. A segment 30 may have an attribute value for an attribute describing a feature of the segment 30. For example, an attribute value may indicate that a segment 30 belongs to a specific layer of a multi-layer mask set. As another example, an attribute value may indicate that a segment 30 belongs to a type of polygon within a single layer mask or mask set. Segments 30 may be adjusted to compensate for deviations. According to one embodiment, specific segments 30 may be selected for adjustment using attribute values.

According to the illustrated embodiment, mask pattern 10 may comprise layer patterns such as trim layer pattern 20, zero phase layer pattern 22, and pi phase layer pattern 24, which are described in more detail with reference to FIGS. 1B and 1C. Mask pattern 10, however, may include any suitable number of patterns for any suitable mask layers. For example, mask pattern 10 may comprise a single pattern for a single layer.

FIG. 1B illustrates trim layer pattern 20 that includes a transparent region pattern 26 and an opaque region pattern 27. Trim layer pattern 20 represents the pattern of a trim mask. A trim mask may comprise a binary mask or other suitable photomask. A trim mask may have a substrate comprising a substantially transparent material, such as quartz, operable to transmit light. An patterned opaque layer may be disposed outwardly from the substrate to yield a trim mask having a substantially opaque region and a substantially transparent region. Transparent region pattern 26 represents the pattern of the substantially transparent region, and opaque region pattern 27 represents the pattern of the substantially opaque region. The opaque layer may comprise a substantially opaque material, such as chromium, operable to block light.

FIG. 1C illustrates zero phase layer pattern 22, pi phase layer pattern 24, and an opaque region pattern 28. Zero phase layer pattern 22 and pi phase layer pattern 24 represents the pattern of an alternating phase shift mask or other suitable photomask. An alternating phase shift mask may have a substrate comprising a substantially transparent material, such as quartz, operable to transmit light. The substrate may be etched to form zero phase regions and pi phase regions. Zero phase layer pattern 22 represents the pattern of the zero phase regions, and pi phase layer pattern 24 represents the pattern of the pi phase regions. Light passing through a pi phase region may be 180° out of phase from light passing through a zero phase region. Accordingly, light passing through a zero phase region and an adjacent pi phase region may destructively interfere to form a sharper pattern line.

An opaque layer may be patterned outwardly from the substrate to yield a substantially opaque region. The opaque layer may comprise a substantially opaque material, such as chromium, operable to block light. Opaque region pattern 28 represents the pattern of the substantially opaque region.

Referring back to FIG. 1, mask pattern 10 may have portions designed to pattern specific features of an object such as an integrated circuit. For example, mask pattern 10 may have a portion 40 designed to pattern an interconnect region, and a portion 42 designed to pattern other types of regions such as a transistor gate.

Mask pattern 10 may be required to pattern features according to critical dimensions. A critical dimension is a dimension that may be required to be defined with a high degree of accuracy. For example, a mask pattern 10 that defines a transistor gate may have the channel length of the gate as a critical dimension. The channel length may be required to be defined with an accuracy of, for example, approximately one nanometer.

Mask pattern 10 may be corrected for deviations that may occur during the manufacturing process of an integrated circuit. Deviations may result from, for example, optical diffraction, etch effects, mask-making effects, resist effects, or other effects occurring during the manufacturing process. To compensate for these deviations, mask pattern 10 may be adjusted according to a proximity correction procedure such as an optical proximity correction (OPC). Proximity correction may be performed using, for example, optical proximity correction software such as PROTEUS software by SYNOPSYS INCORPORATED.

The mask layer patterns 20, 22, and 24, may be divided into segments 30 to perform the proximity correction procedure. A segment may refer to a portion of a line of a pattern that may be individually updated during correction. A segment 30 may have an alignment that indicates whether the segment 30 is aligned horizontally or vertically with respect to a coordinate grid. A line of segments 30 may have a direction that indicates the order in which the segments 30 are to be corrected.

A segment 30 may have one or more attribute values for one or more attributes. An attribute represents a general feature of segments 30, and an attribute value for a particular segment 30 describes the feature of the particular segment 30. Typically, an attribute may represent a feature used to select segments 30 to update during the correction process. As an example, an attribute may represent layer patterns to which segments 30 of mask 10 may belong, and an attribute value for a segment 30 may denote the particular layer pattern 20, 22, or 24 to which the segment 30 belongs. According to one embodiment, segments 30 of the trim polygons of trim layer pattern 20 may be assigned a first attribute value, segments 30 of the zero phase polygons of zero phase layer pattern 22 may be assigned a second attribute value, and segments 30 of the pi phase polygons of pi phase layer pattern 24 may be assigned a third attribute value.

An attribute may represent any other suitable feature of a segment 30. According to one embodiment, an attribute may describe whether a segment 30 requires high precision correction. For example, an attribute value may indicate whether a segment 30 is associated with a critical dimension region that may require higher precision correction, or an inactive region that may be patterned with lower precision. According to another embodiment, an attribute may indicate the length or position of a segment 30. For example, an attribute value may indicate whether a segment 30 is at a corner, at an edge, or at an end of a region. According to another embodiment, an attribute may describe the direction or alignment of a segment 30. For example, an attribute value may indicate whether a segment 30 is horizontal and has a right or left direction, or vertical and has an up or down direction.

According to one embodiment for performing correction, a representation of the pattern, including segments, is stored in a database, and a correction procedure operates on the representation. Correction values are calculated for selected segments 30, and only the selected segments 30 are submitted to the portion of the correction procedure that updates the segments. The correction procedure does not operate on the segments 30 that are not selected. Updating only selected segments 30 may improve efficiency. Moreover, there is no need to set the correction values of non-selected segments 30 to zero, as may be required by some correction techniques.

For example, during an iteration, specific segments 30 may be selected according to one or more attribute values, and a correction value that effects a correction movement may be calculated for each selected segment 30. A correction movement for a segment 30 may refer to a change in position of the segment 30 to correct a mask pattern 10, and a correction value may be calculated using the proximity correction procedure. The change in position may be given with respect to a coordinate grid, the original position of the segment 30, or the position of another segment 30.

After calculating the correction values, only the selected segments 30 are submitted to the portion of the correction procedure that updates the segments according to the respective correction values. Updating segments 30 may refer to calculating the next position of the segments 30, determining how to connect the segments 30 in their next positions, or both the steps of calculating and determining. Moving segments 30 may refer to determining how to represent the segments 30 in their next positions, actually representing the segments 30 in their next positions, outputting the representation, or any combination of the preceding. During a next iteration, segments 30 may be selected using the same attribute values, or segments 30 may be selected using different attribute values.

According to one embodiment, selecting specific segments 30 to be corrected during a first iteration allows for segments 30 of a second iteration to be adjusted with respect to the positions of segments 30 corrected during the first iteration. That is, during a first iteration, a first set of segments 30 may be adjusted, and during a second iteration, a second set of segments 30 may be adjusted with respect to the first set of segments 30.

During each iteration, the embodiment submits a first set of two sets segments to the procedure for updating. The second set is not submitted. Accordingly, the procedure does not need to process the second set, so their correction values do not need to be set to zero, as may be required by some correction techniques. As an example, during a first iteration, a first set of segments 30 comprising segments 30 of trim layer pattern 20 is selected for updating, while a second set of segments 30 comprising segments 30 of zero phase layer pattern 22 and pi phase layer pattern 24 is not selected. The correction values of only the first set are calculated, and the only first set is updated. It is not necessary to enter zero for the correction values of the second set, as may be required by some correction techniques. During a second iteration, the second set is selected for updating. The correction values of only the second set are calculated, and only the second set is updated. During each iteration, the segments that are not selected are not updated.

As another example, during a first iteration, a first set of segments 30 comprising vertical segments 30 with an up direction and horizontal segments 30 with a right direction may be selected for updating. During a second iteration, a second set of segments 30 comprising vertical segments 30 having a down direction and horizontal segments 30 having a left direction may be selected for updating.

Adjusting a first set of segments 30 and then adjusting a second set of segments 30 with respect to the first set may provide for more efficient convergence to critical dimensions, which may in turn provide for more efficient convergence to a corrected mask pattern 10. For example, a first segment 30 may be adjusted to define a portion of a feature having a critical dimension, and second segment 30 may be adjusted with respect to the first segment 30 to satisfy the critical dimension. For example, a first segment 30 may be adjusted to define one side of a gate having a critical width, and second segment 30 may be adjusted with respect to the first segment 30 to position the other side of the gate to satisfy the critical width.

According to one embodiment, selecting specific segments 30 to be corrected allows for certain segments 30 to be corrected more or fewer times than other segments 30. Certain segments 30 may not require precise adjustment. For example, segments 30 used to define field regions may require less precise adjustment than segments 30 used to define a gate region. Segments 30 that require less precise adjustment may have fewer correction iterations than segments 30 that require more precise adjustment.

In summary, segments 30 are selected. Correction values for the selected segments are calculated. The selected segments are submitted to the portion of the correction procedure that updates the selected segments 30.

Modifications, additions, or omissions may be made to mask pattern 10 without departing from the scope of the invention. For example, mask pattern 10 may include more, fewer, or other layer patterns. "Each" as used in this document refers to each member of a set or each member of a subset of a set.

FIG. 2 is a block diagram illustrating one embodiment of a system 110 for correcting a mask pattern 10. According to the illustrated embodiment, system 110 includes a client system 120, a server system 124, and a database 128 coupled as shown.

According to one embodiment, client system 120 allows a user to communicate with a server system 124 to correct mask pattern 10. Server system 124 manages applications that correct mask pattern 10 such as a correction module 130. Correction module 130 performs a correction procedure on mask pattern 10. An example of a method that may be performed by correction module 130 is presented with reference to FIG. 3. Database 128 stores data used by server system 124.

Client system 120, server system 124, and database 128 may each operate on one or more computers and may include appropriate input devices, output devices, mass storage media, processors, memory, or other components for receiving, processing, storing, and communicating information according to the operation of system 110. For example, the present invention contemplates the functions of any combination of client system 120, server system 124, and database 128 being provided using a single computer system, for example, a single personal computer. As used in this document, the term "computer" refers to any suitable device operable to execute instructions and manipulate data to perform operations, for example, a personal computer, work station, network computer, wireless telephone, personal digital assistant, one or more microprocessors within these or other devices, or any other suitable processing device.

Client system 120, server system 124, and database 128 may be integrated or separated according to particular needs. If any of client system 120, server system 124, and database 128 are separated, the separated component may be coupled to the other components using a bus, a local area network (LAN), a metropolitan area network (MAN), a wide area network (WAN), a global computer network such as the Internet, or any other appropriate wire line, wireless, or other link.

Modifications, additions, or omissions may be made to system 110 without departing from the scope of the invention. Moreover, the operations of system 110 may be performed by more, fewer, or other modules. For example, the operations of correction module 130 may be performed by more than one module. Additionally, operations of system 110 may be performed using any suitable logic comprising software, hardware, other logic, or any suitable combination of the preceding.

FIG. 3 is a flowchart illustrating one embodiment of a method for correcting a mask pattern 10. Mask pattern 10 may be corrected to generate a mask that defines a desired pattern on an object. The method begins at step 200, where mask pattern 10 is accessed. Correction module 130 may access mask pattern 10 stored at database 128. Mask pattern 10 may be divided into segments 30 at step 204. A segment 30 may be updated and moved according to a calculated correction value in order to correct mask pattern 10.

Attribute values of segments 30 are established at step 208. A segment 30 may have an attribute value that describes an attribute of the segment 30. For example, an attribute may represent a layer pattern to which a segment 30 belongs, and an attribute value may indicate whether a segment 30 belongs to trim layer pattern 20, zero phase layer pattern 22, or pi phase layer pattern 24.

Specific segments 30 are selected at step 212 using one or more attribute values. For example, the one or more attribute values may indicate any of or any combination of trim layer pattern 20, zero phase layer pattern 22, or pi phase layer pattern 24. A correction value is calculated for the selected segments 30 at step 216. The correction value may be calculated by, for example, an optical proximity correction technique.

The selected segments 30 are updated according to the correction values at step 220. The selected segments 30 may be updated by calculating the next positions of the selected segments 30, determining how to connect the segments 30 in their next positions, or both the steps of calculating and determining. If there is a next iteration at step 224, the method returns to step 212 to select the next segments 30 using one or more attribute values. If there is no next iteration at step 224, the method proceeds to step 228, where corrected mask pattern 10 is reported. After reporting corrected mask pattern 10, the method terminates.

Any suitable segments 30 may be selected for adjustment during a particular iteration. According to one example, segments 30 belonging to the trim, zero phase, and pi phase layer patterns 20, 22, and 24 are selected for adjustment during the first and second iterations. During the third iteration, segments 30 of the trim layer pattern 20 are selected, and during the fourth iteration, segments 30 of the phase and zero phase layer patterns 22 and 24 are selected. Segments 30 of the pi phase layer pattern 24 are selected during a fifth iteration, and segments 30 of the zero phase layer pattern 22 are selected during a sixth iteration.

Modifications, additions, or omissions may be made to the method without departing from the scope of the invention. The method may include more, fewer, or other steps. Additionally, steps may be performed in any suitable order without departing from the scope of the invention.

Certain embodiments of the invention may provide one or more technical advantages. A technical advantage of one embodiment may be that specific segments of a mask pattern may be selected for adjustment during an iteration of a correction procedure. The segments may be selected according to attribute values. Adjusting specific segments may provide for more targeted correction of a mask pattern. Another technical advantage of one embodiment may be that adjusting selected segments instead of all segments during an iteration may improve computational efficiency. Another technical advantage of one embodiment may be that certain segments may be adjusted during a first iteration, and different segments may be adjusted during a second iteration with respect to the segments adjusted during the first iteration.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. A method for correcting a mask pattern, comprising:
   accessing a mask pattern for a mask, the mask pattern segmented into a plurality of segments;
   establishing an attribute value of a plurality of attribute values for each segment of the plurality of segments, the attribute value for a segment describing an attribute of the segment; and
   repeating the following for one or more of the plurality of attribute values to generate a corrected mask pattern:
     selecting one or more segments of the plurality of segments using one or more attribute values of the plurality of attribute values;
     calculating a current correction value for each of the selected segments, the current correction values calculated with respect to one or more previously selected segments moved according to one or more previously calculated correction values; and
     updating the selected segments according to the current correction values;
   wherein repeating the following for one or more of the plurality of attribute values to generate a corrected mask pattern further comprises repeating the following for more iterations for a first attribute value than for a second attribute value, the first attribute value requiring higher precision correction than the second attribute value.

2. The method of claim 1, further comprising graphically moving the selected segments according to the current correction values.

3. The method of claim 1, wherein calculating a current correction value for each of the selected segments further comprises calculating a current correction value to obtain a critical dimension with respect to a previously selected segment of the one or more previously selected segments.

4. The method of claim 1,
   wherein the attribute represents a mask layer pattern to which a segment belongs.

5. The method of claim 1, wherein
   the plurality of attribute values indicate at least two of a trim layer pattern, a zero phase layer pattern, and a pi phase layer pattern.

6. The method of claim 1, wherein repeating the following for one or more of the plurality of attribute values to generate a corrected mask pattern further comprises:
   repeating the following for more iterations for an attribute value indicating a zero phase layer pattern than for an attribute value indicating a trim layer pattern; and
   repeating the following for more iterations for an attribute value indicating a pi phase layer pattern than for the attribute value indicating the trim layer pattern.

7. The method of claim 1, wherein:
   the attribute represents a direction of a segment; and
   the plurality of attribute values further comprise at least two of an up direction, a down direction, a right direction, and a left direction.

8. The method of claim 1, wherein:
   the attribute represents an alignment of a segment; and
   the plurality of attribute values further comprise a horizontal alignment and a vertical alignment.

9. A system for correcting a mask pattern, comprising:
   a database operable to store a mask pattern for a mask, the mask pattern segmented into a plurality of segments; and
   a server system coupled to the database and operable to:
     establish an attribute value of a plurality of attribute values for each segment of the plurality of segments, the attribute value for a segment describing an attribute of the segment; and
     repeat the following for one or more of the plurality of attribute values to generate a corrected mask pattern:
       select one or more segments of the plurality of segments using one or more attribute values of the plurality of attribute values;
       calculate a current correction value for each of the selected segments, the current correction values calculated with respect to one or more previously selected segments moved according to one or more previously calculated correction values; and
       update the selected segments according to the current correction values, wherein the server system is further operable to repeat the following for one or more of the plurality of attribute values to generate a corrected mask pattern by repeating the following for more iterations for a first attribute value than for a second attribute value, the first attribute value requiring higher precision correction than the second attribute value.

10. The system of claim 9, wherein the server system is further operable to graphically move the selected segments according to the current correction values.

11. The system of claim 9, wherein the server system is further operable to calculate a current correction value for each of the selected segments by calculating a current correction value to obtain a critical dimension with respect to a previously selected segment of the one or more previously selected segments.

12. The system of claim 9, wherein the attribute represents a mask layer pattern to which a segment belongs.

13. The system of claim 9, wherein:
the attribute represents a mask layer pattern to which a segment belongs; and
the plurality of attribute values indicate at least two of a trim layer pattern, a zero phase layer pattern, and a pi phase layer pattern.

14. The system of claim 9, wherein the server system is further operable to repeat the following for one or more of the plurality of attribute values to generate a corrected mask pattern by:
repeating the following for more iterations for an attribute value indicating a zero phase layer pattern than for an attribute value indicating a trim layer pattern; and
repeating the following for more iterations for an attribute value indicating a pi phase layer pattern than for the attribute value indicating the trim layer pattern.

15. The system of claim 9, wherein:
the attribute represents a direction of a segment; and
the plurality of attribute values further comprise at least two of an up direction, a down direction, a right direction, and a left direction.

16. The system of claim 9, wherein:
the attribute represents an alignment of a segment; and
the plurality of attribute values further comprise a horizontal alignment and a vertical alignment.

17. Software for correcting a mask pattern, the software embodied in a medium and operable to:
access a mask pattern for a mask, the mask pattern segmented into a plurality of segments;
establish an attribute value of a plurality of attribute values for each segment of the plurality of segments, the attribute value for a segment describing an attribute of the segment; and
repeat the following for one or more of the plurality of attribute values to generate a corrected mask pattern:
select one or more segments of the plurality of segments using one or more attribute values of the plurality of attribute values;
calculate a current correction value for each of the selected segments, the current correction values calculated with respect to one or more previously selected segments moved according to one or more previously calculated correction values; and
update the selected segments according to the current correction values; wherein the repeating the following for one or more of the plurality of attribute values to generate a corrected mask pattern is accomplished by repeating the following for more iterations for a first attribute value than for a second attribute value, the first attribute value requiring higher precision correction than the second attribute value.

18. The software of claim 17, further operable to graphically move the selected segments according to the current correction values.

19. The software of claim 17, further operable to calculate a current correction value for each of the selected segments by calculating a current correction value to obtain a critical dimension with respect to a previously selected segment of the one or more previously selected segments.

20. The software of claim 17, wherein the attribute represents a mask layer pattern to which a segment belongs.

21. The software of claim 17, wherein:
the attribute represents a mask layer pattern to which a segment belongs; and
the plurality of attribute values indicate at least two of a trim layer pattern, a zero phase layer pattern, and a pi phase layer pattern.

22. The software of claim 17, further operable to repeat the following for one or more of the plurality of attribute values to generate a corrected mask pattern by:
repeating the following for more iterations for an attribute value indicating a zero phase layer pattern than for an attribute value indicating a trim layer pattern; and
repeating the following for more iterations for an attribute value indicating a pi phase layer pattern than for the attribute value indicating the trim layer pattern.

23. The software of claim 17, wherein:
the attribute represents a direction of a segment; and
the plurality of attribute values further comprise at least two of an up direction, a down direction, a right direction, and a left direction.

24. The software of claim 17, wherein:
the attribute represents an alignment of a segment; and
the plurality of attribute values further comprise a horizontal alignment and a vertical alignment.

25. A method for correcting a mask pattern, comprising:
accessing a mask pattern for a mask, the mask pattern segmented into a plurality of segments;
establishing an attribute value of a plurality of attribute values for each segment of the plurality of segments, the attribute value for a segment describing an attribute of the segment, wherein:
a first attribute represents a mask layer pattern to which a segment belongs, and a plurality of first attribute values indicate at least two of a trim layer pattern, a zero phase layer pattern, and a pi phase layer pattern;
a second attribute represents a direction of a segment, and a plurality of second attribute values comprise at least two of an up direction, a down direction, a right direction, and a left direction; and
a third attribute represents an alignment of a segment, and a plurality of third attribute values comprise a horizontal alignment and a vertical alignment; and
repeating the following for one or more of the plurality of attribute values to generate a corrected mask pattern, the following being repeated by:
repeating the following for more iterations for a first attribute value indicating a zero phase layer pattern than for a first value indicating a trim layer pattern;
repeating the following for more iterations for a first attribute value indicating a pi phase layer pattern than for the first attribute value indicating the trim layer pattern; and
repeating the following for more iterations for a fourth attribute value than for a fifth attribute value, the fourth attribute value requiring higher precision correction than the fifth attribute value, the following being repeated:

selecting one or more segments of the plurality of segments using one or more attribute values of the plurality of attribute values;

calculating a current correction value for each of the selected segments, the current correction values calculated with respect to one or more previously selected segments moved according to one or more previously calculated correction values, a current correction value calculated to obtain a critical dimension with respect to a previously selected segment of the one or more previously selected segments;

updating the selected segments according to the current correction values; and graphically moving the selected segments according to the current correction values.

* * * * *